United States Patent [19]
Sato et al.

[11] Patent Number: 5,956,601
[45] Date of Patent: Sep. 21, 1999

[54] METHOD OF MOUNTING A PLURALITY OF SEMICONDUCTOR DEVICES IN CORRESPONDING SUPPORTERS

[75] Inventors: Sumie Sato; Jun Ohmori, both of Kanagawa-ken, Japan

[73] Assignee: Kabushiki Kaisha Toshiba, Tokyo, Japan

[21] Appl. No.: 08/839,358

[22] Filed: Apr. 17, 1997

[30] Foreign Application Priority Data

Apr. 25, 1996 [JP] Japan ................................. 8-105359

[51] Int. Cl.⁶ .............................. H01L 21/30; H01L 21/46
[52] U.S. Cl. ...................... 438/458; 438/107; 438/114; 438/118
[58] Field of Search .................................. 438/458, 107, 438/114, 118

[56] References Cited

U.S. PATENT DOCUMENTS

| | | | |
|---|---|---|---|
| 4,264,917 | 4/1981 | Ugon . | |
| 4,523,371 | 6/1985 | Wakashima | 438/118 |
| 4,916,662 | 4/1990 | Mizuta . | |
| 4,943,464 | 7/1990 | Gloton et al. . | |
| 5,068,714 | 11/1991 | Seipler | 438/119 |
| 5,102,828 | 4/1992 | Marchisi | 438/123 |
| 5,134,773 | 8/1992 | Le Maire et al. | 438/124 |
| 5,153,818 | 10/1992 | Mukougawa et al. . | |
| 5,169,056 | 12/1992 | Reele et al. | 438/118 |
| 5,192,682 | 3/1993 | Kodai et al. | 438/126 |
| 5,272,374 | 12/1993 | Kodai et al. . | |
| 5,273,938 | 12/1993 | Lin et al. | 438/107 |
| 5,284,784 | 2/1994 | Manley | 438/267 |
| 5,297,148 | 3/1994 | Harari et al. . | |
| 5,299,089 | 3/1994 | Lwee . | |
| 5,352,632 | 10/1994 | Sawaya | 438/123 |
| 5,365,655 | 11/1994 | Rose | 438/124 |
| 5,375,037 | 12/1994 | Le Roux . | |
| 5,469,399 | 11/1995 | Sato et al. . | |
| 5,480,842 | 1/1996 | Clifton et al. | 438/464 |
| 5,508,971 | 4/1996 | Cernea et al. . | |
| 5,535,328 | 7/1996 | Harari et al. . | |
| 5,550,709 | 8/1996 | Iwasaki . | |
| 5,563,825 | 10/1996 | Cernea et al. . | |
| 5,568,424 | 10/1996 | Cernea et al. . | |
| 5,572,478 | 11/1996 | Sato et al. . | |
| 5,592,420 | 1/1997 | Cernea et al. . | |
| 5,596,532 | 1/1997 | Cernea et al. . | |
| 5,602,987 | 2/1997 | Harari et al. . | |
| 5,608,673 | 3/1997 | Rhee . | |
| 5,621,685 | 4/1997 | Cernea et al. . | |
| 5,638,321 | 6/1997 | Lee et al. . | |
| 5,663,901 | 9/1997 | Wallace et al. . | |
| 5,693,570 | 12/1997 | Cernea et al. . | |

FOREIGN PATENT DOCUMENTS

| | | |
|---|---|---|
| 214478 | 3/1987 | European Pat. Off. . |
| 2301155 | 12/1990 | Japan . |
| 416396 | 1/1992 | Japan . |

*Primary Examiner*—Kevin M. Picardat
*Assistant Examiner*—Deven Collins
*Attorney, Agent, or Firm*—Pillsbury Madison & Sutro

[57] ABSTRACT

A method of manufacturing a semiconductor device mountable in a module supporter. According to the present invention, a semiconductor substrate has a plurality of semiconductor modules, where each semiconductor module has a semiconductor chip covered with a protective material, such as resin, on a first surface and a connector formed on a second surface which is electrically connected to the semiconductor chip. An adhesive layer is applied to the first surface of the substrate. The adhesive layer has a plurality of opening portions arranged to positionally correspond to the plurality of semiconductor modules on the substrate. The substrate and the adhesive layer are cut into individual substrates each having the semiconductor chip so that each semiconductor module has the adhesive layer on a periphery of the protective material. Individual substrates containing a semiconductor module are bonded to the supporter having a concave portion for holding the semiconductor module.

13 Claims, 7 Drawing Sheets

METHOD OF MOUNTING A PLURALITY OF SEMICONDUCTOR DEVICES IN CORRESPONDING SUPPORTERS

FIELD OF THE INVENTION

This invention relates to a manufacturing method for a semiconductor device, and more particularly to a method of bonding a plurality of semiconductor module and a substrate supporting it in a corresponding plurality of supporters.

BACKGROUND OF THE INVENTION

Figure 4:
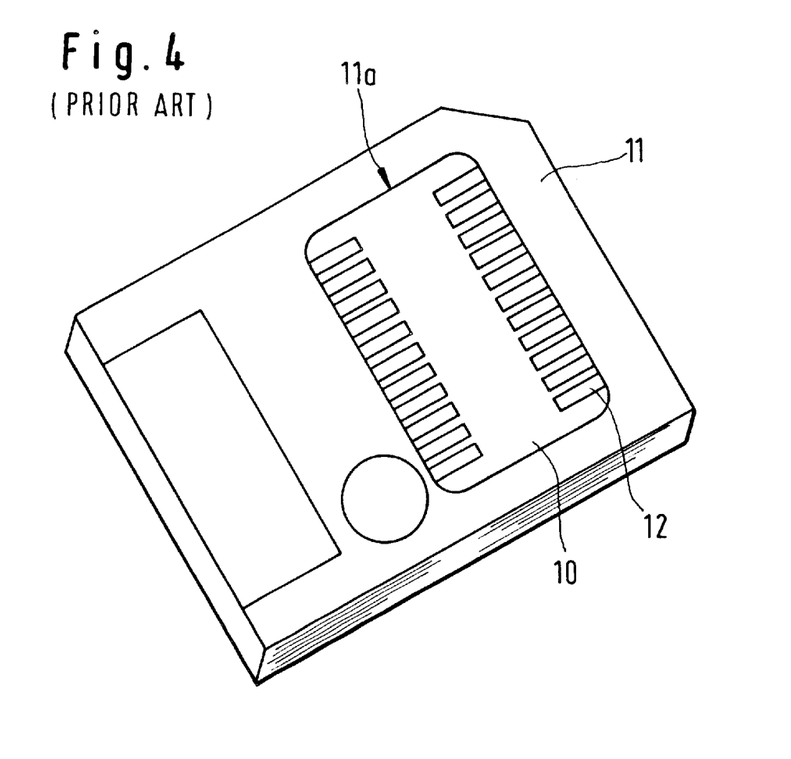
FIG. 4 shows a card-type module.
Figure 5A:
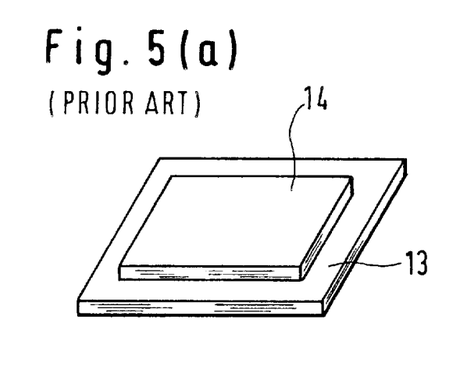
FIGS. 5(a) and 5(b) show a semiconductor module.
Figure 5B:
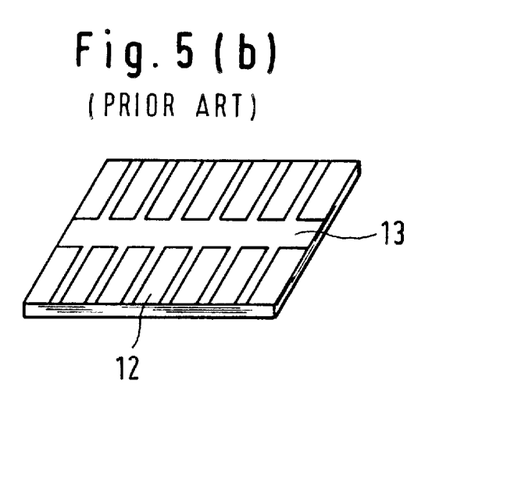
Figure 6:
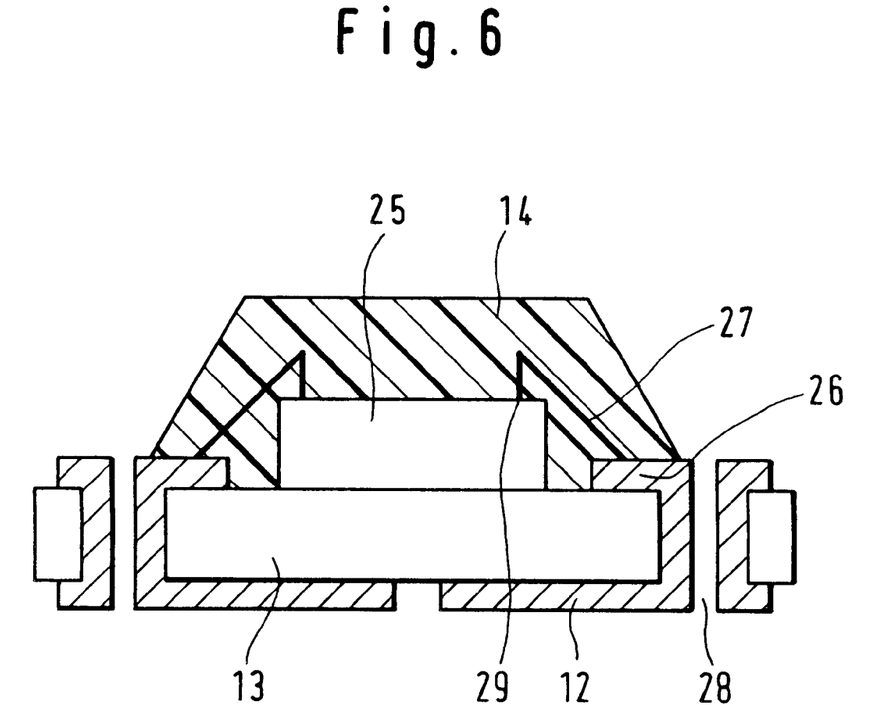
FIG. 6 is a sectional view of the semiconductor module.

In recent years, a card-type memory device, such as an IC card, has been put into practical use. Some IC cards comprise a detachable card-type module which contains a memory. FIG. 4 shows an example of the card-type module commonly used in portable computers. FIGS. 5(a), 5(b) and 6 show a semiconductor module used for the card-type module. In particular, FIG. 5(a) is a perspective view of a surface of the semiconductor module which is sealed by resin. FIG. 5(b) is a perspective view of the bottom surface of the semiconductor module on which terminals connected to the external circuit are provided. FIG. 6 is a cross-sectional view of the semiconductor module. In the semiconductor module shown in FIG. 6, a semiconductor chip 25 is bonded on the surface of a substrate 13, and a bonding pad 29 of the semiconductor chip 25 is connected by a gold wire 27 to a terminal formed on the substrate 13 to be connected to the semiconductor chip. The semiconductor chip may be connected to the chip connecting terminal on the substrate by a flip-chip bonding technique using a bump. The semiconductor chip 25 is then sealed by a molding portion 14. Typically, a non-volatile semiconductor memory, such as a flash EEPROM, is used as the semiconductor chip 25. The periphery of the substrate 13 is exposed to the outside and surrounds the resin mold section 14. The opposite surface of the substrate is provided with a plain connection terminal 12 which can be connected to external circuits. Commonly, the external connection terminal 12 is connected to the chip connecting terminal 26 by a through hole 28.

Referring to FIG. 4, a semiconductor module 10 formed in the above-mentioned manner is bonded to a concave portion 11a of a module supporter 11 made of resin or plastic, so that the semiconductor module 10 is embedded in the concave portion 11a. The external connection terminals 12 are exposed to the outer environment on substantially the same plain as that of the module supporter 11. The periphery portion of the substrate 13 is bonded to the concave portion 11a of the module supporter 11, preferably, with the use of liquid or sheet-like adhesive.

Figure 7A:
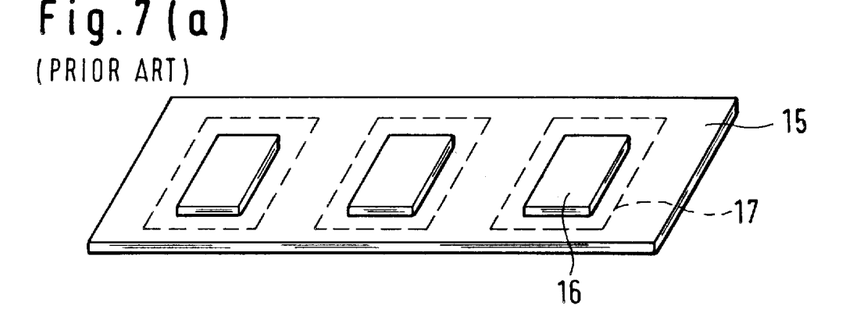
FIGS. 7(a)–7(c) show a conventional bonding method.
Figure 7B:
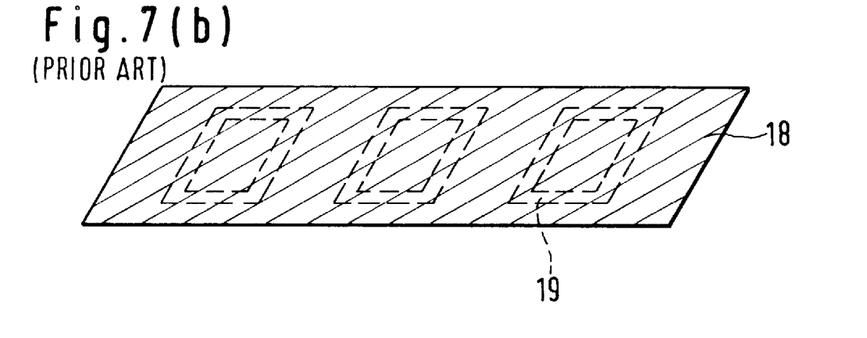
Figure 7C:
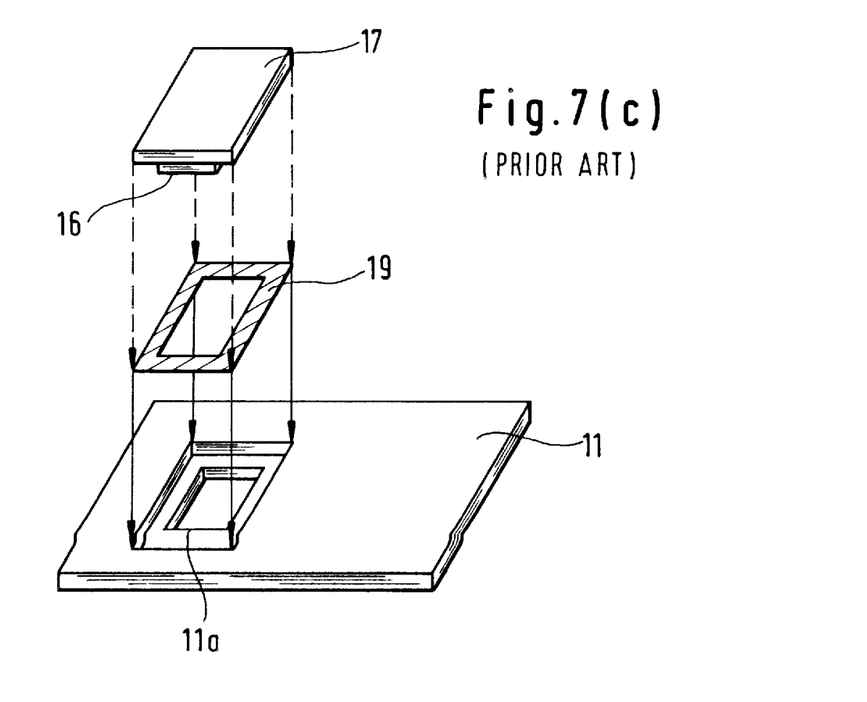
Figure 8A:
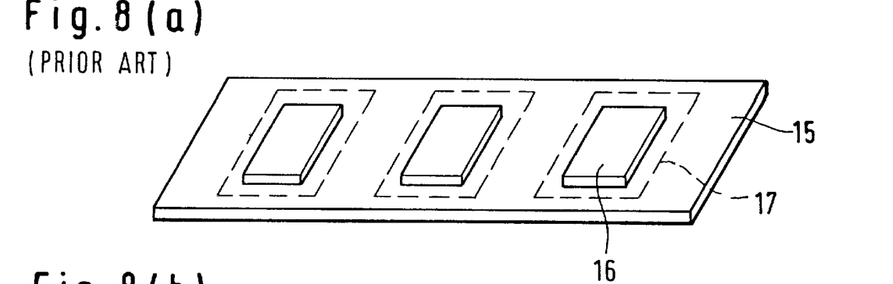
FIGS. 8(a)–8(d) show another conventional bonding method.
Figure 8B:
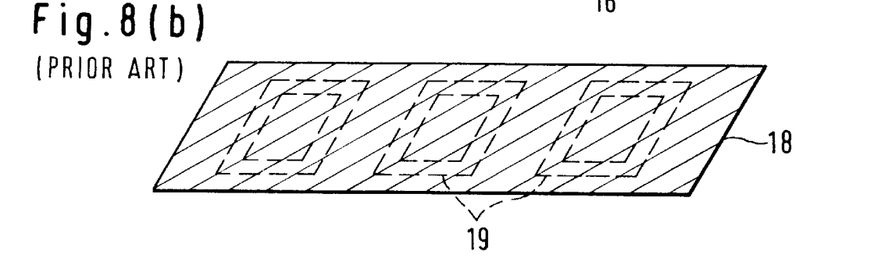
Figure 8C:
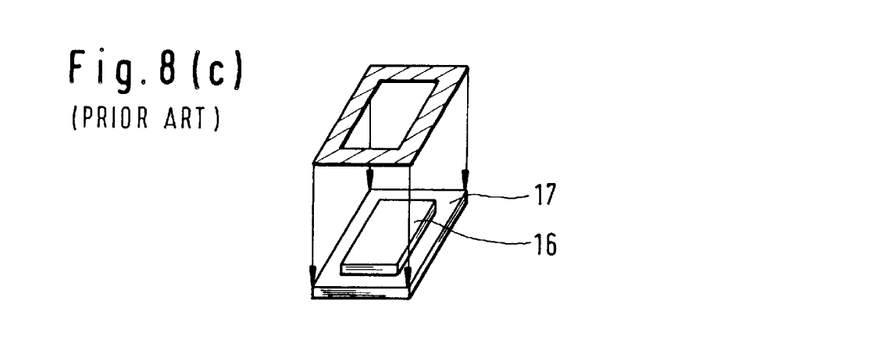
Figure 8D:
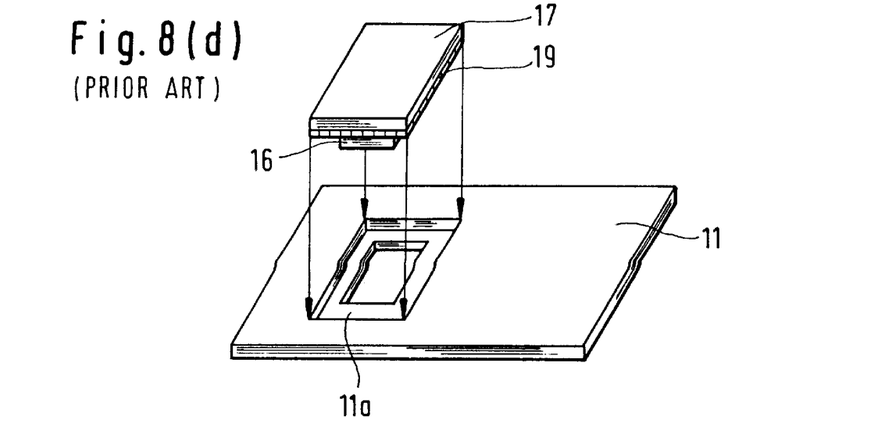

FIGS. 7(a)–7(c) show one method of bonding a semiconductor module and a module supporter with the sheet-like adhesive piece. As shown in FIG. 7 (a), a semiconductor module 17 is cut away from a substrate 15 which has a plurality of serially arranged semiconductor modules. In particular, a resin mold section 16 corresponding to each semiconductor module 17 is serially arranged on the substrate 15. Next, adhesive pieces 19, each having a shape corresponding to a bonding interface of a semiconductor module and a module supporter, are cut away from an adhesive sheet 18, as shown in FIG. 7(b). Each adhesive piece has a shape of a frame. The adhesive sheet 18 and the adhesive pieces 19 have adhesive materials on both sides. Each adhesive piece 19 is then applied to the concave portion 11a of the module supporter 11, as shown in FIG. 7(c). Finally, as shown in FIG. 7(c), the semiconductor module 17 is placed substantially on top of the adhesive piece 19 for bonding to the module supporter 11.

FIG. 8 shows an alternative method for bonding a semiconductor module and a module supporter with the sheet-like adhesive pieces. As shown in FIG. 8(a), a semiconductor module 17 is cut away from a substrate 15 which has a plurality of serially arranged semiconductor modules. Next, adhesive pieces 19 each having the same area as that of one semiconductor module are cut away from an adhesive sheet 18, as shown in FIG. 8(b). Subsequently, each of the adhesive pieces 19 is applied to the semiconductor module 17, as shown in FIG. 8(c). The semiconductor module 17 is then placed substantially on top of the concave portion 11a of the module supporter 11, such that the semiconductor module 17 applied with the adhesive pieces 19 is bonded to the concave portion 11a of the module supporter 11, as shown in FIG. 8(d).

Alternatively, when a liquid adhesive is used to bond the semiconductor module 17 with the module supporter 11, a semiconductor module 17 is cut away from a plurality of semiconductor modules formed on a substrate 15. Then, the liquid adhesive is applied to the portion of the module supporter, on which the semiconductor module is to be bonded.

In the conventional process described above, it is difficult to cut away from the adhesive sheet the adhesive pieces each having the shape of the bonding portion of the module supporter 11 for bonding the semiconductor module and the module supporter. To cut the adhesive pieces having the corresponding shape of the bonding portion with a die, the adhesive sheet must be divided into three portions (i.e., outer portion, frame portion, and inner portion), and thus a special die is required. Further, the cutting edge of the die become dull after continuous use so that the adhesive material from the adhesive sheet smears over the die.

In addition, the adhesive piece cut in the shape of the bonding portion of the module supporter 11 is very thin, small, sticky and light. As a result, handling of the adhesive piece can be problematic. In particular, if the user wishes to perform the bonding process automatically, it may be impossible for a machine to deal with such an adhesive piece with ease.

It is also difficult to precisely align the adhesive pieces with the bonding portion of the module supporter 11. In particular, if the adhesive piece is misaligned, the adhesive piece may undesirably protrude beyond the bonding surface and encroach on the external connection terminals. This misalignment results in a undesirable appearance and increases the defect rate in the final products.

To prevent such misalignment of the adhesive piece to the bonding surface, an adhesive piece having a smaller adhesive area than that of the bonding portion might be used. However, a small adhesive piece does not have strong adhesion.

SUMMARY OF THE INVENTION

It is an object of the present invention to provide a method for packaging a semiconductor module with a module supporter using an adhesive piece without the above described problems.

According to one embodiment of the present invention, a semiconductor substrate has a plurality of semiconductor modules, where each semiconductor module has a semiconductor chip covered with a protective material, such as resin, on a first surface and a connector formed on a second surface which is electrically connected to the semiconductor chip. An adhesive layer is applied to the first surface of the substrate. The adhesive layer has a plurality of opening portions arranged to correspond to the plurality of semiconductor modules on the substrate. The adhesive layer may be wound onto a reel for easy handling. Then the substrate and the adhesive layer are cut into individual substrates, each having the semiconductor chip so that each semiconductor module has the adhesive layer on a periphery of the protective material. An individual substrate containing a semiconductor module is then bonded to a supporter having a concave portion for holding the semiconductor module.

In the above embodiment, it is preferable that the protective material covering the semiconductor chip be smaller than the concave portion of the supporter so that any bending pressure applied to the supporter is not substantially transferred to the semiconductor chip residing inside the protective material.

According to another embodiment of the present invention, the adhesive layer may have a plurality of adhesive portions each shaped like a frame to surround the periphery of the semiconductor module. The plurality of adhesive portions are arranged to correspond to the plurality of semiconductor modules on the substrate.

These and other aspects, features and advantages of the present invention will be better understood by studying the detailed description in conjunction with the drawings and the accompanying claims.

BRIEF DESCRIPTION OF THE DRAWINGS

A detailed description of embodiments of the present invention will be made with reference to the accompanying drawings, wherein like numerals designate corresponding parts in the several figures.

DETAILED DESCRIPTION OF PREFERRED EMBODIMENTS

Figures 1A, 1B, 1C, 1D:
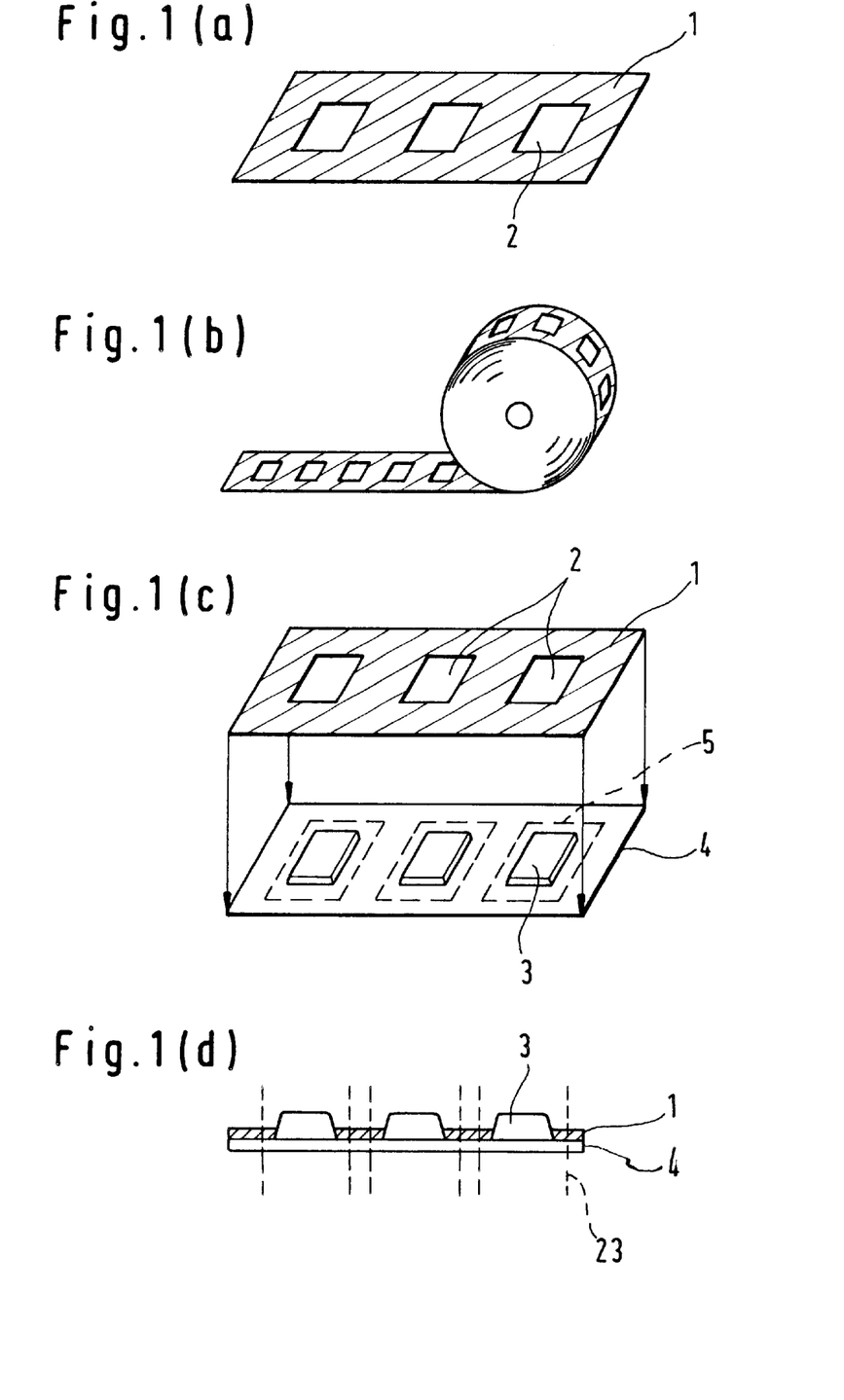
FIGS. 1(a)–1(d) show a first embodiment of the present invention where an adhesive layer is being applied to a substrate.

Preferred embodiments of the present invention are described in detail hereinbelow with reference to the attached drawings. FIGS. 1(a)–1(d) and 2(a)–2(c) show a first embodiment of the present invention. In particular, FIG. 1(c) shows a plurality of semiconductor chips (residing inside the molding portions 3) arranged at a predetermined interval on a substrate 4 formed of any suitable material, such as resin. The adhesive sheet 1 having double adhesive sides is formed by applying adhesive on one side of peelable paper (not shown) releasably secured to the adhesive sheet and has opening portions 2, as shown in FIG. 1(a). The opening portions 2 are formed to correspond to the arrangement of the molding portion 3 of the semiconductor modules.

The adhesive sheet 1 with a peelable paper may be wound into a reel as shown in FIG. 1(b). As shown in FIG. 1(c), the opening portions 2 of the adhesive sheet 1 are aligned with the molding portions 3 and applied to the substrate 4 on which a plurality of the semiconductor modules 5 are arranged.

Figure 2A:
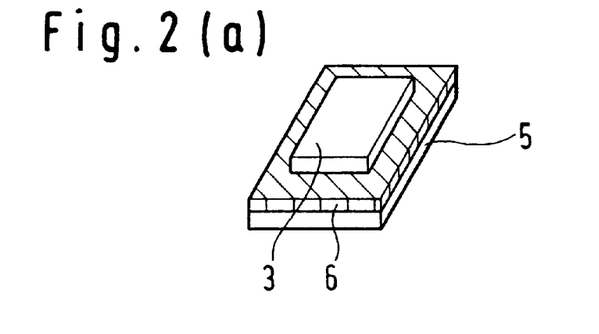
FIGS. 2(a)–2(c) show a first embodiment of the present invention where a semiconductor module is bonded to a support module.
Figure 2B:
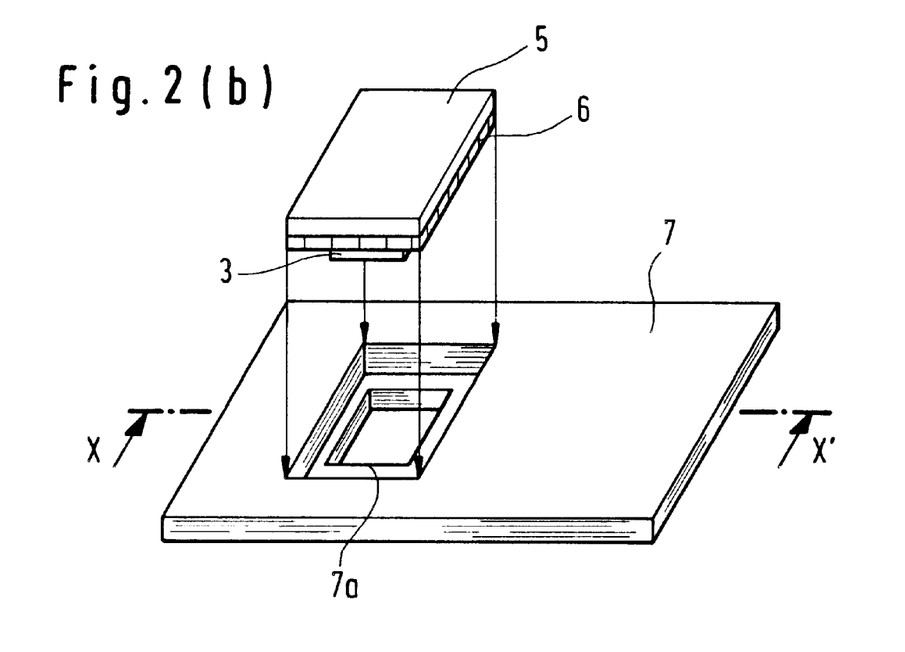

Next, as shown in FIG. 1(d), the substrate 4 on which the adhesive sheet 1 is applied is cut along the die lines 23. In the preferred embodiment, the adhesive sheet 1 and the semiconductor modules 5 are simultaneously cut to result in individual modules, one of which is shown in FIG. 2(a). The semiconductor modules 5 each have a properly aligned adhesive piece 6 around the molding portions 3. The peelable paper may be detached from the adhesive piece either before or after the die-cutting process. Finally, as shown in FIG. 2(b), the semiconductor module 5 with the adhesive piece 6 is bonded to a concave portion 7a of the module supporter 7.

As an alternative to bonding the adhesive sheet 1 and the adhesive piece 6 to the substrate 4, thermal compression may be used. Thermal compression may be used when the adhesive sheet 1 is applied to the substrate 4 having a plurality of the semiconductor modules, or when the semiconductor modules 5 are bonded to the module supporter 7.

When the adhesive sheet 1 is applied to the substrate 4 by thermal compression, the adhesive sheet 1 may be temporarily attached to the substrate 4 until the semiconductor module 5 is bonded to the module supporter 7 by thermal compression. If the adhesive sheet 1 uses an adhesive not requiring the thermal compression step, the above-mentioned step need not be performed.

When the adhesive sheet 1 is applied to the substrate 4 having a plurality of the semiconductor modules, the adhesive sheet 1 may be applied simultaneously on the entire surface of the substrate 4. Alternatively, the adhesive sheet 1 may be sequentially applied to each module portion 3.

As described above, in the preferred embodiment, an adhesive sheet 1 having a plurality of holes is used to simultaneously bond against a plurality of semiconductor sheets. By performing the simultaneous bonding process in such a manner, the opening portions 2 and the molding portions 3 are properly aligned and may require only one bonding process.

Figure 2C:
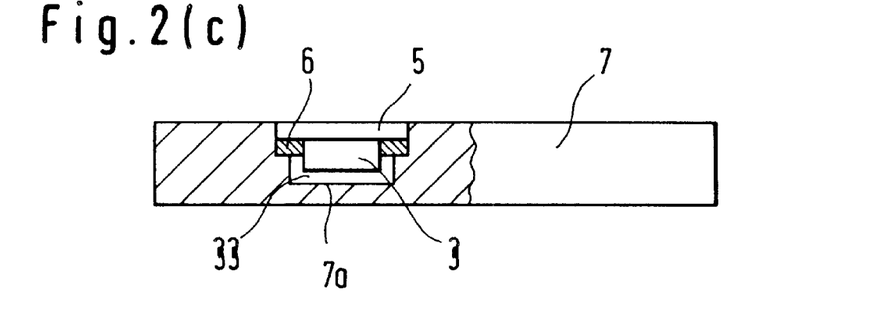

FIG. 2(c) shows a cross-sectional view of the devices shown in FIG. 2(b) taken along a line X—X. As shown in FIG. 2(c), the semiconductor module 5 applied with the adhesive piece 6 on its periphery is bonded to the concave portion 7a of the module supporter 7. As a result, the bending stress exerted on the module supporter 7 is not forced upon a semiconductor chip 25 contained in the molding portion 3, because the size of the molding 3 is smaller than that of the concave portion 7a. In other words, a gap 33 created between the molding portion 3 and the bottom of the concave portion 7a substantially blocks any pressure applied to the molding portion 3.

To alleviate the application pressure, the adhesive sheet 1 is not applied on top the molding portion 3. If the adhesive sheet 1 is applied to the entire surface of the semiconductor module 5 so as to cover the substantially entire molding portion 3, the bending stress or pressure exerted on the module supporter 7 may be transferred to the semiconductor chip 25 thus damaging the same. In any event, the adhesive sheet 1 cannot easily be applied evenly to the semiconductor module 5 due to the irregular and non-flat surface of the molding portion 3.

Figure 3A:
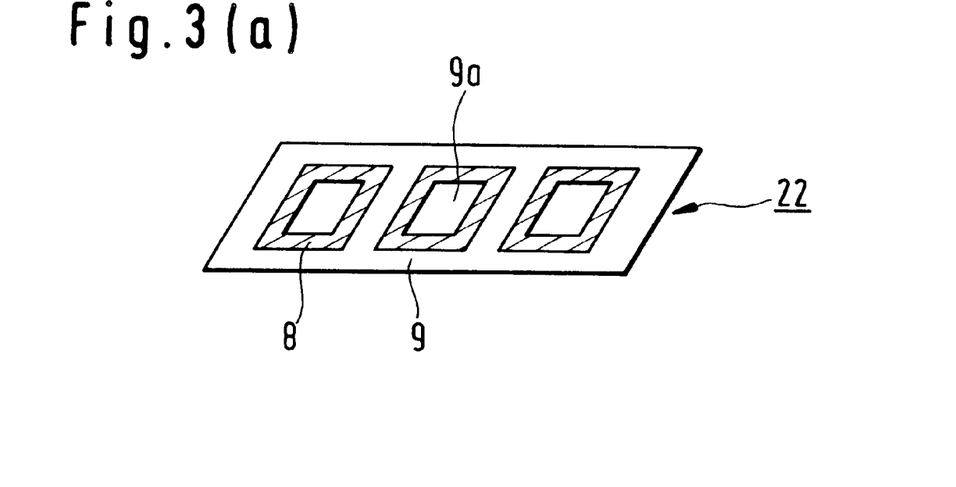
FIGS. 3(a)–3(c) show a second embodiment of the present invention.
Figure 3B:
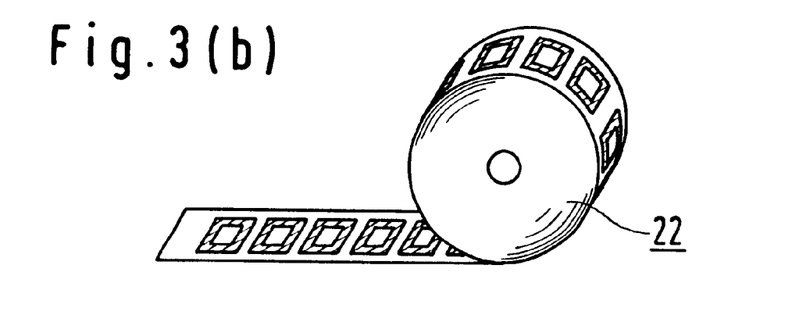
Figure 3C:
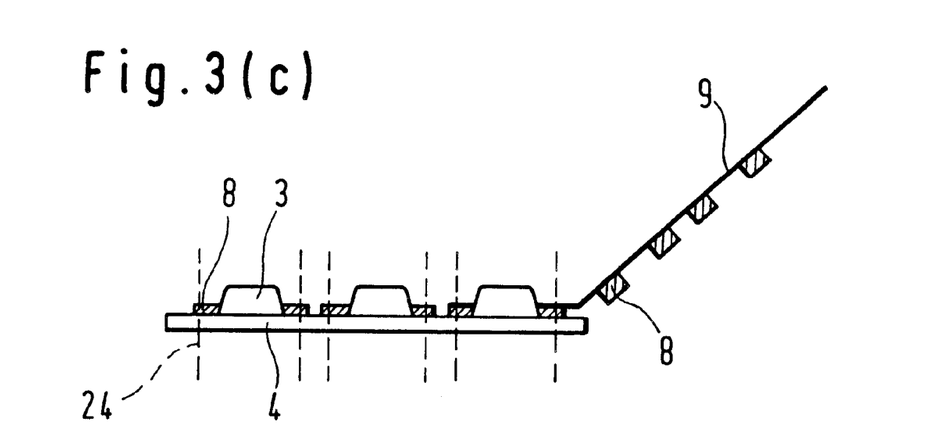

FIGS. 3(a)–3(c) shows a second embodiment of the present invention. In particular, FIG. 3(c) shows a plurality of semiconductor chips (residing inside the molding portions 3) arranged at a predetermined interval on a substrate 4 formed of material such as resin or tape. As shown in FIG. 3(a), the adhesive sheet 22 is formed, for example, by applying an adhesive piece 8 formed in a shape of a frame or a rectangle on the surface of peelable paper. The adhesive piece 8 is formed in a shape having an inner dimensions substantially the same as that of the bonding interface of the semiconductor module and the module supporter and an outer dimensions larger than the bonding interface. The adhesive piece 8 is positioned on the peelable paper to correspond the arrangement of the molding portions 3 on the substrate 4. The adhesive sheet 22 has opening portions 9a which are formed by die-cutting the peelable paper on the portions corresponding to the inner dimensions of the frame-shaped adhesive piece 8. Similar to the first embodiment of the present invention, the adhesive sheet 22 may be wound onto a reel as shown in FIG. 3(b).

Then, as shown in FIG. 3(c), the adhesive pieces 8 on the adhesive sheet 9 are sequentially applied to the substrate 4 having a plurality of the semiconductor modules 5, such that the molding portion 3 is inserted in the opening portions 9a. Next, the substrate 4 having the adhesive pieces 8 is cut along the die lines 24. As a result, the adhesive pieces 8 and the semiconductor modules are simultaneously cut. Consequently, the semiconductor modules 5 having the adhesive piece 6 shown in FIG. 2(a) are rendered. The peelable paper 9 may be detached from the adhesive piece 6 either before or after the die-cutting process. Finally, as shown in FIG. 2(b), the semiconductor module 5 with the adhesive piece 6 is bonded to a concave portion 7a of the module supporter 7.

As described above, the second embodiment is intended to simultaneously bond an adhesive sheet to a plurality of semiconductor sheets. By performing the simultaneous bonding process in such a manner, the opening portions 2 and the molding portions 3 can be properly aligned and may require only one bonding process.

As described above, according to the various embodiments of the present invention, an adhesive sheet having a plurality of holes is simultaneously bond to a plurality of semiconductor sheets. Thus, the process period can be shortened and the alignment can be performed with more ease.

In addition, according to the present invention, the semiconductor modules and the adhesive pieces are simultaneously die-cut, and the number of steps in manufacturing process is reduced. Further, the semiconductor modules are die-cut after the adhesive piece is applied, and thus the adhesion of the adhesive piece to the external connection electrodes, which is caused by the misalignment of the adhesive piece can be prevented. By virtue of this feature, the defect rate is reduced.

Additionally, according to the present invention, the entire bonding portion of the semiconductor module can be applied with the adhesive. Accordingly, adhesive strength is increased, and the mechanical strength of an IC card using the semiconductor device formed in such a manner is improved, thus improving reliability of the device.

Since the molding portion 3 has a smaller size than that of the concave portion 7a of the module supporter, and the top surface of the molding portion 3 is not in contact with the module supporter, the bending stress exerted on the module supporter is not transferred to the semiconductor chip residing in the molding portion 3.

The above-mentioned process according to the present invention may be used with semiconductor modules having external connection terminals 12 on the opposite surface of the molding surface, as shown in FIG. 5(b). The semiconductor module constructed using the present invention is preferably mounted in a module supporter 11 formed of resin having, for example, a length, a width, and a thickness of 37 mm×45 mm×0.76 mm, respectively.

The card-type module is connected to an adapter card (not shown). The adapter card may be configured to be used with a PCMCIA card slot or the like. The adapter card includes an insertion hole for receiving a card-type module therein, and a standard connector for attaching to, for example, a PCMCIA card slot of a personal computer. The adapter card has an interior provided with a connector for being contacted with the external-connection terminal of the card-type module and an interface circuit for functioning as an interface between the card-type module and an external apparatus, such as a personal computer. Also, the adapter card may be of types other than a PCMCIA card. Furthermore, a connector may be provided, together with the interface circuit, in the main body of a personal computer or a camera to communicate with the external-connection terminal of the card-type module.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of manufacturing a semiconductor device mountable in a supporter, the method comprising:

preparing a plurality of semiconductor modules, all the semiconductor modules being on one substrate, in which each semiconductor module has a semiconductor chip covered with a protective material on a first surface of the substrate and a connector formed on a second surface of the substrate and electrically connected to the semiconductor chip;

applying an adhesive layer to the first surface of the substrate, the adhesive layer being in the form of a sheet having a plurality of opening portions arranged to positionally correspond to the plurality of semiconductor modules on the substrate;

cutting both the substrate and the adhesive layer into individual substrates having the semiconductor chip so that each semiconductor module has the adhesive layer on a periphery of the protective material; and bonding each one of the individual substrates containing a semiconductor module to a corresponding supporter.

2. A method according to claim 1, wherein the protective material is resin.

3. A method according to claim 1, wherein the supporter has a concave portion for holding the semiconductor module, in which the periphery of the protective material is securely attached to the concave portion so that the connector to the semiconductor chip is accessible.

4. A method according to claim 3, wherein the protective material covering the semiconductor chip is smaller than the concave portion of the supporter so that a gap is formed between the protective material and the supporter.

5. A method according to claim 1, wherein the adhesive layer removably secured to a peelable layer.

6. A method of manufacturing a semiconductor device mountable in a supporter, the method comprising:

preparing a plurality of semiconductor modules, all the semiconductor modules being on one substrate, in which each semiconductor module has a semiconductor chip covered with a protective material on a first surface of the substrate and a connector formed on a second surface of the substrate and electrically connected to the semiconductor chip;

applying an adhesive layer to the first surface of the substrate, the adhesive layer being in the form of a sheet, and the adhesive layer having a plurality of individual adhesive portions each shaped to surround the periphery of the semiconductor module, wherein the plurality of individual adhesive portions are arranged to positionally correspond to the plurality of semiconductor modules on the substrate;

cutting both the substrate and the adhesive layer into individual substrates having the semiconductor chip so that each semiconductor module has the adhesive layer on a periphery of the protective material; and bonding each one of the individual substrates containing a semiconductor module to a corresponding supporter.

7. A method according to claim 6, wherein the adhesive layer is resin.

8. A method according to claim 6, wherein the supporter has a concave portion for holding the semiconductor nodule, in which the periphery of the protective material is securely attached to the concave portion so that the connector to the semiconductor chip is accessible.

9. A method according to claim 8, wherein the protective material covering the semiconductor chip is smaller than the concave portion of the supporter so that a gap is formed between the protective material and the supporter.

10. A method according to claim 6, wherein the adhesive layer includes the plurality of adhesive portions removably attached to a peelable paper layer.

11. A method according to claim 6, wherein each adhesive portion has a rectangular frame shape to match a rectangular shape of the protective material covering the semiconductor chip.

12. A method of manufacturing a semiconductor device mountable in a supporter, the method comprising:

preparing a plurality of semiconductor modules, all the semiconductor modules being on one substrate, in which each semiconductor module has a semiconductor chip covered with a protective material on a first surface of the substrate and a connector formed on a second surface of the substrate and electrically connected to the semiconductor chip;

applying an adhesive layer to the first surface of the substrate, the adhesive layer being in the form of a sheet having a plurality of opening portions arranged to positionally correspond to the plurality of semiconductor modules on the substrate, wherein the adhesive layer is wound onto a reel;

cutting both the substrate and the adhesive layer into individual substrates having the semiconductor chip so that each semiconductor module has the adhesive layer on a periphery of the protective material; and bonding each one of the individual substrates containing a semiconductor module to a corresponding supporter.

13. A method of manufacturing a semiconductor device mountable in a supporter, the method comprising:

preparing a plurality of semiconductor modules, all the semiconductor modules being on one substrate, in which each semiconductor module has a semiconductor chip covered with a protective material on a first surface of the substrate and a connector formed on a second surface of the substrate and electrically connected to the semiconductor chip;

applying an adhesive layer to the first surface of the substrate, the adhesive layer being in the form of a sheet, and the adhesive layer having a plurality of individual adhesive portions each shaped to surround the periphery of the semiconductor module, wherein the plurality of individual adhesive portions are arranged to positionally correspond to the plurality of semiconductor modules on the substrate, and the adhesive layer is wound onto a reel;

cutting both the substrate and the adhesive layer into individual substrates having the semiconductor chip so that each semiconductor module has the adhesive layer on a periphery of the protective material; and bonding each one of the individual substrates containing a semiconductor module to a corresponding supporter.

* * * * *